United States Patent
Tada et al.

(10) Patent No.: US 9,544,558 B2
(45) Date of Patent: Jan. 10, 2017

(54) MEASURING APPARATUS AND MEASURING METHOD

(71) Applicant: Lasertec Corporation, Yokohama (JP)

(72) Inventors: Koyo Tada, Yokohama (JP); Hiroto Nozawa, Yokohama (JP); Hideo Takizawa, Yokohama (JP)

(73) Assignee: Lasertec Corporation (JP)

( * ) Notice: Subject to any disclaimer, the term of this patent is extended or adjusted under 35 U.S.C. 154(b) by 153 days.

(21) Appl. No.: 14/558,278

(22) Filed: Dec. 2, 2014

(65) Prior Publication Data
US 2015/0304616 A1 Oct. 22, 2015

(30) Foreign Application Priority Data
Dec. 4, 2013 (JP) .................. 2013-250891

(51) Int. Cl.
*G01B 9/02* (2006.01)
*H04N 9/31* (2006.01)
*G01J 9/02* (2006.01)
*G03F 1/00* (2012.01)
*G01M 11/00* (2006.01)

(52) U.S. Cl.
CPC ........ *H04N 9/3191* (2013.01); *G01B 9/02098* (2013.01); *G01J 9/02* (2013.01); *G03F 1/00* (2013.01); *G01M 11/00* (2013.01)

(58) Field of Classification Search
CPC .............. G01M 11/00; G01J 9/02; G03F 1/26; G03F 1/84; G03F 1/0046; G03F 1/0061; G03F 1/0053; G01B 9/02098
See application file for complete search history.

(56) References Cited

U.S. PATENT DOCUMENTS 5,426,503 A * 6/1995 Kusunose ................. G03F 1/84
                                                                   250/372
2008/0174786 A1     7/2008  Takizawa et al.

FOREIGN PATENT DOCUMENTS

| JP | 2005-083974 | 3/2005 |
| JP | 2005083974 | * 3/2005 ............... G01J 9/02 |
| JP | 2008-185582 | 8/2008 |

OTHER PUBLICATIONS

Office Action issued on Jul. 29, 2014 on patent application JP2013-250891.

* cited by examiner

*Primary Examiner* — Kara E Geisel
*Assistant Examiner* — Maurice Smith
(74) *Attorney, Agent, or Firm* — Faegre Baker Daniels LLP

(57) ABSTRACT

Provided is a phase shift amount measuring apparatus and method capable of measuring a phase shift amount and a transmittance of a phase shift mask in one measurement step by using a miniaturized monitor pattern. The phase shift amount and transmittance of the monitor pattern are simultaneously measured using a shearing interferometer. The phase shift amount is obtained from a phase difference of interference light between light passing through the monitor pattern and light passing through a non-pattern area. The transmittance of the monitor pattern is obtained using an amplitude of interference light between light passing through the monitor pattern and light passing through the non-pattern area and an amplitude of interference light between light beams passing through the non-pattern area. The use of common interference images in measuring the phase shift amount and transmittance enables measurement of both the phase shift amount and the transmittance in one measurement operation.

8 Claims, 7 Drawing Sheets

MEASURING APPARATUS AND MEASURING METHOD

INCORPORATION BY REFERENCE

This application is based upon and claims the benefit of priority from Japanese patent application No. 2013-250891, filed on Dec. 4, 2013, the disclosure of which is incorporated herein in its entirety by reference.

BACKGROUND OF THE INVENTION

1. Field of the Invention

The present invention relates to a measuring apparatus and a measuring method which measure a phase shift amount and a transmittance of a phase shift mask.

2. Description of Related Art

As photomasks designed to handle the miniaturization of LSIs, half-tone type phase shift masks and Levenson type phase shift masks have been put into practical use. The phase shift masks are each provided with a phase shifter that gives a phase difference of $\pi$ or an odd multiple of $\pi$ to light passing through adjacent pattern elements of a mask pattern. For example, in the half-tone type phase shift masks, a light shielding pattern formed of molybdenum and silicon films operates as a phase shifter, and a phase difference of $\pi$ or an odd multiple of $\pi$ it is introduced between light transmitted through the light shielding pattern and light transmitted through an adjacent opening. In the phase shift masks, the resolution of an exposed pattern decreases along with the deviation of the phase shift amount of a phase shifter from the design value, which leads to deterioration in the quality of a photomask. For this reason, in a photomask production process, the phase shift amount of a phase shifter is one of the important parameters for securing the quality of a phase shifter. The phase shift amount of a phase shifter is measured by using a phase shift amount measuring apparatus.

As a phase shift amount measuring apparatus of a related art, a measuring apparatus that uses two-beam interferometry has been known (for example, see Japanese Unexamined Patent Application Publication No. 2005-83974). In this phase shift amount measuring apparatus of the related art, a monitor pattern of a square phase shifter is formed in a corner portion of a phase shift mask to be inspected, and a coherent light beam emitted from a lighting system is projected toward the monitor pattern. The transmitted beam emitted from the monitor pattern is directed onto a Mach-Zehnder interferometer and is converted into two laterally-shifted beams which are laterally shifted by a predetermined shearing amount. The two laterally-shifted beams form an interference image in which the images of the monitor pattern overlap each other, two interference images in which the image of the monitor pattern and the image of an opening, which are formed on both ends of the interference image, overlap each other, and two interference images in which the images of the opening, which are formed on both ends of the interference images, overlap each other. The interference images formed by the two laterally-shifted beams are picked up by a CCD camera, and the phase shift amount is calculated based on a phase difference between interference lights generated from two interference images in which the light beam transmitted through the monitor pattern and the light beam transmitted through the opening overlap each other.

The phase shift amount and the transmittance of a phase shifter are important physical quantities in the phase shift masks. In other words, the phase shifter functions as a light shielding pattern and operates to specify a resolution and a dose amount in the exposure of light onto a wafer. Accordingly, if the transmittance of the phase shifter is outside of a predetermined range, the resolution and the dose amount in the exposure process fall outside a threshold range, which causes deterioration in the quality of the phase shift mask. For this reason, in the phase shift amount measuring apparatus of the related art, not only the phase shift amount of the phase shifter, but also the transmittance of the light shielding film is measured.

In the phase shift amount measuring apparatus of the related art, the amplitude of the interference fringe that forms the interference image in which the images of the opening overlap each other is measured, and the amplitude of the interference light of the area in which the images of the phase shifter overlap each other is also measured, thereby obtaining the transmittance from the ratio between the two amplitudes (see Japanese Unexamined Patent Application Publication No. 2005-83974).

In the phase shift amount measuring apparatus of the related art, in order to measure the phase shift amount and the transmittance of the phase shifter, it is necessary to form three types of interference images, i.e., an interference image in which the images of the phase shifter overlap each other, two interference images in which the image of the phase shifter and the image of the opening overlap each other, and interference images in which the images of the opening overlap each other. In order to form these three types of interference images, a relatively large monitor pattern is required. This is contrary to the market need for miniaturization of LSIs.

Further, in the phase shift amount measuring apparatus of the related art, the interference images for use in measuring the transmittance of the phase shifter are different from the interference images for use in measuring the phase shift amount of the phase shifter. Therefore, it is necessary to perform the measurement twice while moving a stage. This leads to deterioration in the throughput of the measurement.

An object of the present invention is to realize a phase shift amount measuring apparatus and a phase shift amount measuring method which are capable of measuring a phase shift amount and a transmittance of a phase shifter in one measurement step by using a miniaturized monitor pattern.

SUMMARY OF THE INVENTION

A first exemplary aspect of the present invention is a phase shift amount measuring apparatus that measures a phase shift amount and a transmittance of a phase shifter formed in a phase shift mask, the measuring apparatus including; a lighting system that projects an illumination beam toward a monitor pattern and a peripheral area of the monitor pattern, the monitor pattern being formed on the phase shift mask; an objective lens that condenses light emitted from the phase shift mask; a shearing interferometer that forms first and second laterally-shifted shearing beams from the light condensed by the objective lens, performs a phase modulation of one period on the first and second shearing beams, and forms an interference beam by combining the phase-modulated first and second shearing beams; a photo-detector that receives the interference beam emitted from the shearing interferometer and detects a luminance of first interference light which is interference light between light passing through the monitor pattern of the first shearing beam and light passing through the peripheral area of the second shearing beam, a luminance of second interference light which is interference light between light passing through the monitor pattern of the second shearing beam and light passing through the peripheral area of the first shearing beam, and a luminance of third interference light which is interference light between light passing through the peripheral area of the first shearing beam and light passing through the peripheral area of the second shearing beam; and a signal processor that receives an output signal from the photodetection means and calculates the phase shift amount and the transmittance of the phase shifter.

The present inventors have conducted various analyses on the phase shift amount measuring apparatus that uses the two-beam interferometry and phase shift method. As a result, it has been determined that the measurement of the phase shift amount and the measurement of the transmittance can be performed in parallel by using common interference images. Specifically, in the phase shift amount measuring apparatus of the prior art, the measurement of the transmittance is performed by using the interference image between the images of the phase shifter and the interference image between the images of the opening image, while the measurement of the phase shift amount is performed by using the signal waveform of the interference fringe between the image of the phase shifter and the image of the opening. Accordingly, the use of different interference images for the measurement of the transmittance and the measurement of the phase shift amount leads to an increase in the size of the monitor pattern and makes it necessary to perform the measurement at two locations while moving the stage. On the other hand, in the present invention, the measurement of the transmittance is performed by using the interference image between the image of the monitor pattern and the image of the peripheral area and the interference image between the images of the peripheral area, thereby making it possible to simultaneously perform the measurement of the transmittance and the measurement of the phase shift amount by using common interference images.

A second exemplary aspect of the present invention is a measuring method that measures a phase shift amount and a transmittance of a phase shifter by using a shearing interferometer, the phase shifter being formed in a phase shift mask, the measuring method including the steps of: projecting an illumination beam toward a monitor pattern and a peripheral area of the monitor pattern, the monitor pattern being formed on the phase shift mask; setting a shearing amount of the shearing interferometer in such a manner that two images of the monitor pattern do not overlap each other; forming two laterally-shifted transmitted beams from transmitted light transmitted through the phase shift mask and performing a phase modulation of one period on the two transmitted beams; detecting a luminance of first interference light that forms an interference image between a first image of the monitor pattern and an image of the peripheral area, a luminance of second interference light that forms an interference image between a second image of the monitor pattern and an image of the peripheral area, and a luminance of third interference light that forms an interference image between images of the peripheral area; obtaining, for each of the first to third interference lights, phase modulation data indicating a relationship between a phase modulation amount and a luminance change; and calculating the phase shift amount of the phase shifter based on the phase modulation data on the first and second interference lights, and calculating the transmittance of the phase shifter based on the phase modulation data on the first and third interference light.

According to the present invention, the interference images for use in measuring the phase shift amount are the same as the interference images for use in measuring the transmittance, which makes it possible to measure both the phase shift amount and the transmittance in one measurement operation. Furthermore, since the need for the interference image in which the images of the monitor pattern overlap each other is eliminated, a stripe-shaped monitor pattern can be used. Therefore, it is possible to reduce a size of the monitor pattern.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS

Figure 1:
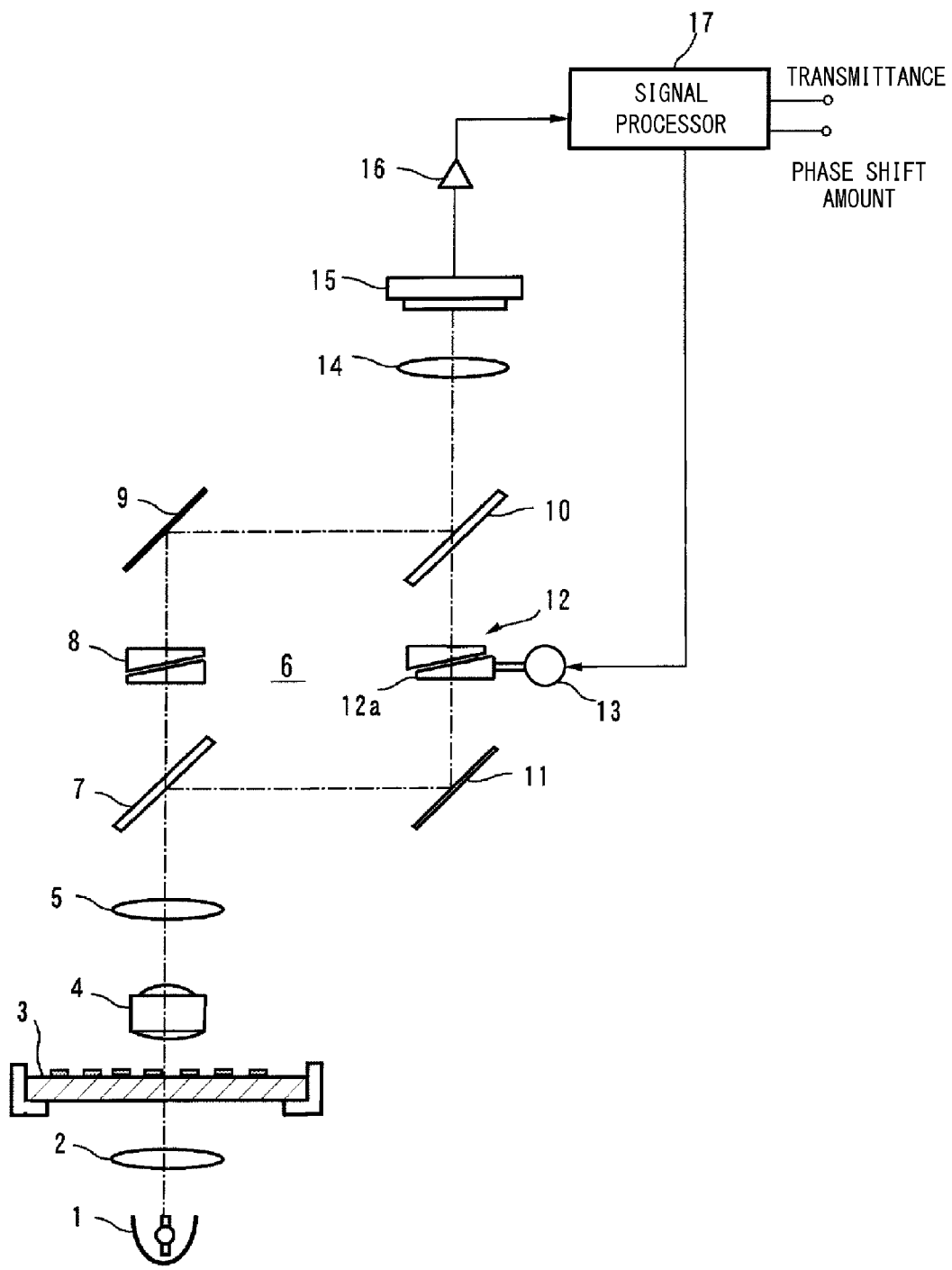
FIG. 1 is a diagram showing an example of a phase shift amount measuring apparatus according to the present invention.

FIG. 1 is a diagram showing an example of a measuring apparatus that measures a physical quantity of a phase shift mask according to the present invention. According to the present invention, in a phase shift mask production process, a mask pattern and a monitor pattern of a phase shifter are formed and the phase shift amount and the transmittance of the monitor pattern of the phase shifter are measured. An illumination light source 1 generates a coherent illumination beam or a partially coherent illumination beam. A light source that emits light having the same wavelength as that of exposure light actually used in an exposure device is used as the illumination light source 1. For example, when an ArF laser is used in the exposure device, light obtained by dispersing light generated from a heavy hydrogen lamp by a prism and having a wavelength of 193.4 nm can be used as the illumination light. Not only an ArF laser, but also a KrF laser that produces a beam having a wavelength of 248 nm can also be used as the illumination light source 1. The illumination beam is condensed via a condenser lens 2 and is projected toward the monitor pattern of a phase shift mask 3 placed on an XY stage. As the phase shift mask to be measured, various phase shift masks, such as a half-tone type phase shift mask, in which a light shielding pattern of a half-tone film is formed on a quartz glass, and a tri-tone type phase shift mask, can be used.

The light emitted from the monitor pattern of the phase shift mask 3 is directed onto a shearing interferometer (two-beam interferometer) 6 through an objective lens 4 and a relay lens 5. This shearing interferometer has a function of forming laterally-shifted images of the mask pattern, combining two laterally-shifted images thus formed, outputting the combined laterally-shifted interference images, and performing fringe-scanning. As the shearing interferometer, various shearing interference optical systems, such as a Mach-Zehnder interference optical system and a Nomarski prism, can be used. In this embodiment, a Mach-Zehnder interferometer is used.

Image light incident on the shearing interferometer 6 is split by a half mirror 7, and first and second shearing beams are formed. The first shearing beam is directed onto a first double wedge prism 8. The first double wedge prism 8 operates to introduce a predetermined amount of lateral shifting between the first shearing beam and the second shearing beam. In this embodiment, the first double wedge prism 8 allows the first shearing beam to be sheared by a predetermined amount. The first shearing beam emitted from the first double wedge prism 8 is directed onto a half mirror 10 through a total reflection mirror 9. The second shearing beam is directed onto the half mirror 10 through a total reflection mirror 11 and a second double wedge prism 12. The second double wedge prism 12 has a function of performing fringe-scanning. One wedge prism 12a of the second double wedge prism 12 is connected to the linear actuator 13, is moved in a direction perpendicular to the optical axis, and gives a phase modulation amount of one period to the second shearing beam. In other words, the second double wedge prism 12 functions as phase modulation means.

The first and second shearing beams which are laterally shifted by a predetermined shearing amount are combined by the half mirror 10, to thereby form an interference beam.

This interference beam is formed an image onto a two-dimensional imaging device 15 through an imaging lens 14. The two-dimensional imaging device 15 receives the light transmitted through the phase shift mask 3. The two-dimensional imaging device 15 includes a plurality of light-receiving elements arranged in a two-dimensional array. The image light incident on each light-receiving element of the two-dimensional imaging device 15 is converted into electric signals. The electric signals of each light-receiving element are sequentially read and supplied to a signal processor 17 through an amplifier 16. The signal processor 17 includes fast Fourier transform means. The fast Fourier transform means of the signal processor 17 calculates the phase shift amount and the transmittance of the monitor pattern.

Figure 2A:
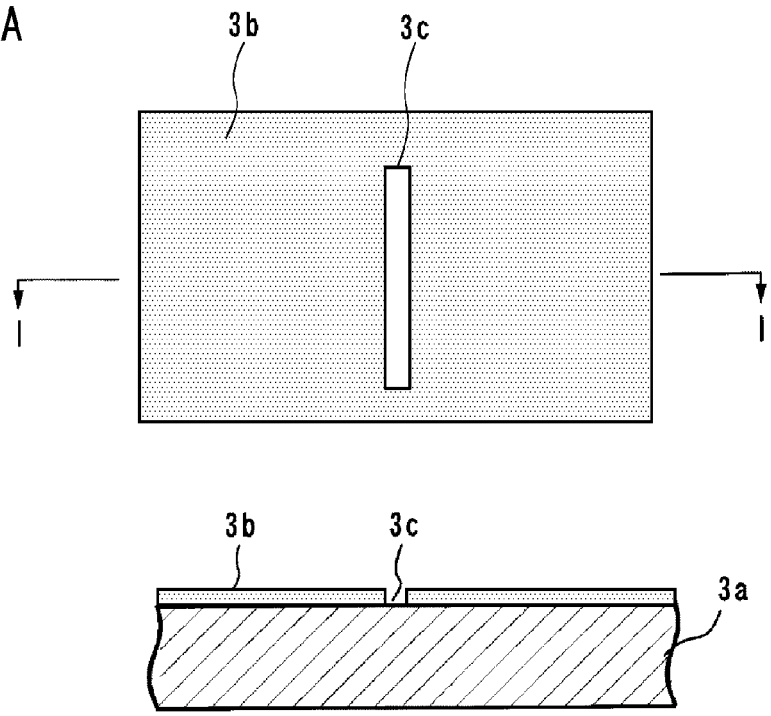
FIG. 2A shows a plan view and a sectional view illustrating an example of monitor patterns according to the present invention.
Figure 2B:
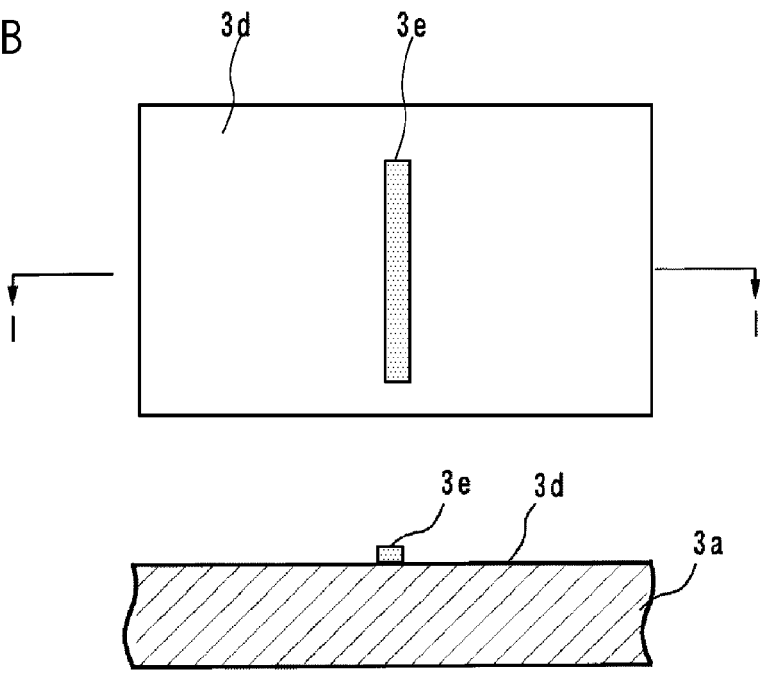
FIG. 2B shows a plan view and a sectional view illustrating an example of monitor patterns according to the present invention.

FIGS. 2A and 2B each show an example of monitor patterns. In this embodiment, the phase shift mask in which a light shielding film and an MoSi half-tone film functioning as a phase shifter are formed on a quartz substrate 3a will be described by way of example. Referring to FIG. 2A, a half-tone film 3b is formed on the quartz substrate 3a and a stripe-like light-transmitting portion (opening) 3c is formed in the half-tone film. As shown in FIG. 2A, the light-transmitting portion 3c corresponds to the monitor pattern ("positive type"), Referring to FIG. 2B, a light-transmitting portion (opening) 3d is formed on the quartz substrate 3a and a stripe-like half-tone film 3e is formed in the light-transmitting portion 3d, As shown in FIG. 2B, the half-tone film 3e corresponds to the monitor pattern ("negative type"), In the example shown in FIG. 2A, the phase shift amount which is a phase difference between the light transmitted through the light-transmitting portion 3c, which corresponds to the monitor pattern, and the light transmitted through the half-tone film (phase shifter) 3b, which corresponds to the peripheral area of the monitor pattern, is measured. In the example shown in FIG. 2B, the phase shift amount which is a phase difference between the light transmitted through the half-tone film (phase shifter) 3e, which corresponds to the monitor pattern, and the light transmitted through the light-transmitting portion 3d, which corresponds to the peripheral area of the monitor pattern, is measured. In this embodiment, the measurement of the phase shift amount and the transmittance by using the monitor pattern shown in FIG. 2A will be described.

According to the present invention, the monitor patterns 3c and 3e are formed in an elongated stripe shape so that the interference image in which the images of the monitor pattern do not overlap each other can be formed in the shearing interferometer. That is, the monitor pattern 3c of the first shearing beam is displaced from the monitor pattern 3c of the second shearing beam in the interference image. The monitor pattern 3c and 3e are elongate in a direction perpendicular to the shearing direction. The lateral dimension of each monitor pattern is set to, for example, 1 µm, and the longitudinal length of each monitor pattern is set to, for example, 10 µm. The use of such an elongated stripe-like monitor pattern can further reduce the dimensions of the monitor pattern.

Figure 3A:
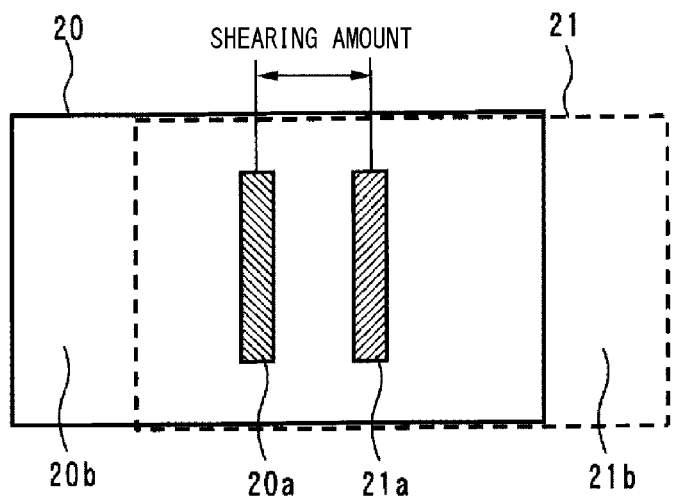
FIG. 3A is a diagram showing an interference image formed on an imaging device.
Figure 3B:
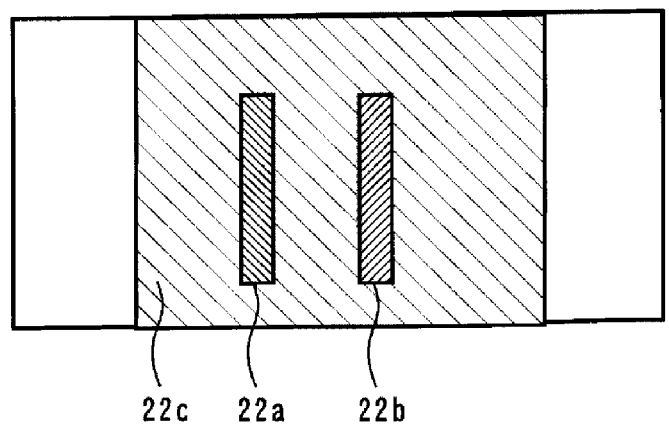
FIG. 3B is a diagram showing an interference image formed on the imaging device.

FIGS. 3A and 3B are diagrams schematically showing laterally-shifted interference images formed on the imaging device 15. FIG. 3A shows the images respectively formed by the first and second shearing beams. FIG. 3B shows the combined laterally-shifted interference images, A first laterally-shifted image 20 is formed by the first shearing beam, A second laterally-shifted image 21 is formed by the second shearing beam. The first laterally-shifted image 20 includes an image 20a of the monitor pattern 3c and an image 20b of the peripheral area. The second laterally-shifted image 21 includes an image 21a of the monitor pattern 3c and an image 21b of the peripheral area. According to the present invention, the shearing amount of the double wedge prism of the shearing interferometer is set to, for example, 10 µm, so that the images of the monitor pattern do not overlap each other.

As shown in FIG. 3B, the interference images formed on the imaging device include a first interference image 22a, a second interference image 22b, and a third interference image 22c.

The first interference image 22a is formed by the interference between the light forming the image of the monitor pattern 3c of the first shearing beam and the light forming the image of the peripheral area of the second shearing beam. The second interference image 22b is formed by the interference between the light forming the image of the peripheral area of the first shearing beam and the light forming the image of the monitor pattern 3c of the second shearing beam.

The third interference image 22c is formed by the interference between the light passing through the peripheral area of the first shearing beam and the light passing through the peripheral area of the second shearing beam. The third interference image is the interference images of light beams passing through the light-transmitting portion 3b.

Figure 3C:
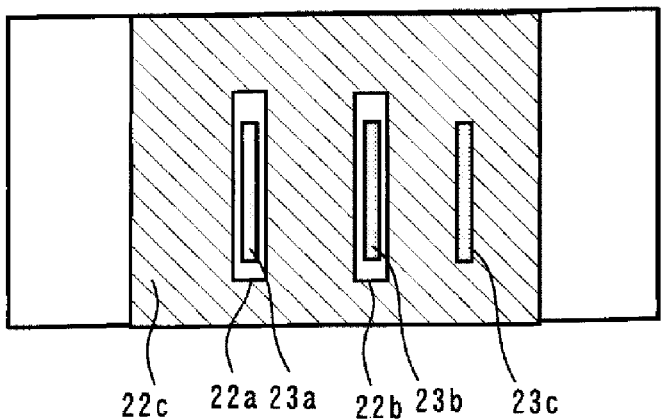
FIG. 3C is a diagram showing three measurement pixel areas of a two-dimensional imaging device.

FIG. 3C shows three measurement pixel areas of the two-dimensional imaging device. A first pixel area 23a detects the luminance of the first interference image 22a. A second pixel area 23b detects the luminance of the second interference image 22b. A third pixel area 23c detects the luminance of the third interference image 22c. An operator specifies the three measurement pixel areas while observing the interference images displayed on a monitor.

Figure 4:
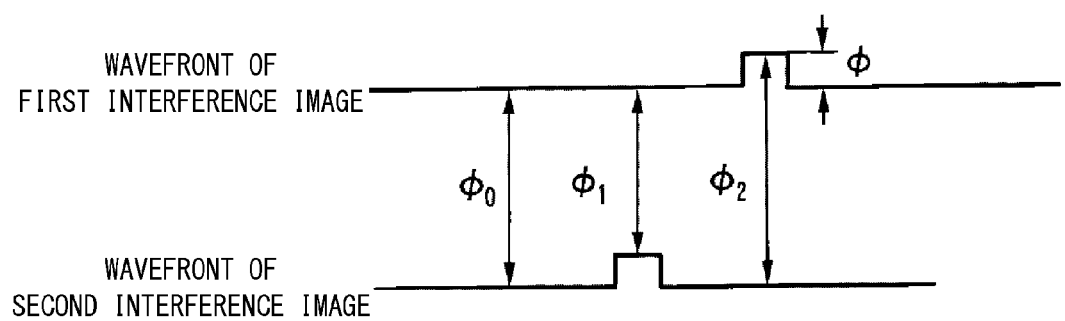
FIG. 4 is a diagram showing states of wavefronts of first and second interference images.

FIG. 4 is a diagram schematically showing a relationship between the wavefronts of the first and second interference images formed by the shearing interferometer. In FIG. 4, ϕ0 represents a phase difference specified by an optical path length difference between the first shearing beam and the second shearing beam; ϕ1 represents a phase difference in the first interference image 22a; ϕ2 represents a phase difference in the second interference image; and ϕ represents a phase shift amount of the monitor pattern corresponding to the phase shifter. Based on the relationship between the wavefronts of two laterally-shifted images, the phase shift amount ϕ, the phase differences ϕ1, ϕ2, and ϕ0 can be expressed by the following equations.

$$\phi=\phi 0-\phi 1$$

$$\phi=\phi 2-\phi 0$$

The phase shift amount ϕ of the monitor pattern is given by the following equation.

$$\phi=(\phi 2-\phi 1)/2$$

Accordingly, the phase shift amount of the monitor pattern is calculated from the phase differences ϕ1 and ϕ2 of the first and second interference images included in the laterally-shifted interference images.

Figure 5:
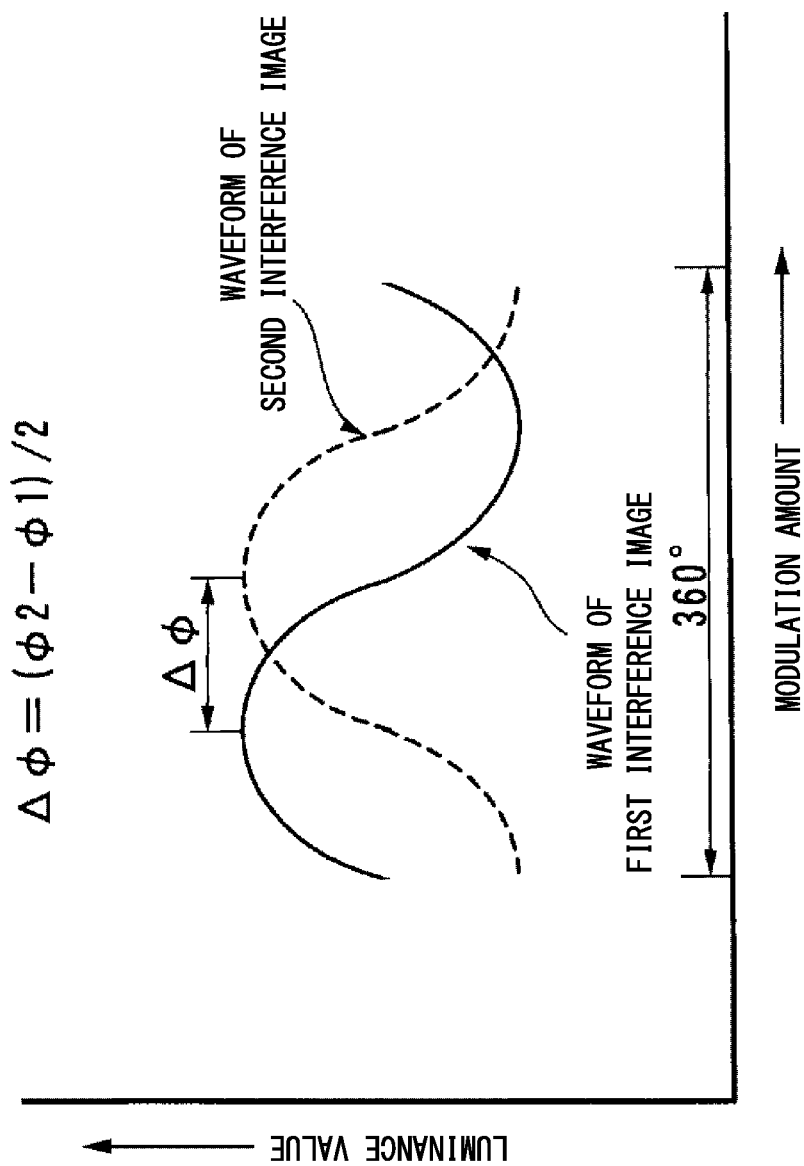
FIG. 5 is a graph showing an example of phase modulation data indicating a relationship between a phase modulation amount and a change in luminance.

FIG. 5 is a graph showing changes in luminance of the first and second interference images 22a and 22b when fringe-scanning is performed by moving the wedge prism 12a in the direction perpendicular to the optical axis direction and a phase modulation of one period is performed. In other words, FIG. 5 is a graph showing a relationship between a phase modulation amount and a change in luminance. The wedge prism 12a is moved by one period, and a phase difference of 2π is introduced in the shearing beam propagating through one optical path. In FIG. 5, a change of the output signal (luminance value) from the light-receiving elements in the first interference image 22a is illustrated by a solid line, and a change of the output signal (luminance value) from the light-receiving elements in the second interference image 22b is illustrated by a broken line. For example, a phase difference between peaks of curves of two luminance changes corresponds to a phase difference between the two interference images 22a and 22b. The fast Fourier transform (FFT) means provided in the signal processor 17 performs fast Fourier transform processing using phase modulation data, thereby calculating the phase difference Δϕ (Δϕ=(ϕ2−ϕ1)/2) between the two interference images. Accordingly, the phase shift amount of the phase shift mask can be obtained by calculating the phase difference between the two interference images by fast Fourier transform processing. The phase modulation amount for used in the phase modulation can be obtained from positional information of the wedge prism 12a. The phase modulation amount can also be obtained from the time associated with the moving speed of the wedge prism 12a.

Next, the measurement of the transmittance of the phase shifter will be described. A luminance I of interference light in the two-beam interferometry is defined by the following basic equation.

$$I=A1^2+A2^2+2\sqrt{A1}\times\sqrt{A2}\times\cos\phi$$

In this case, the luminance of the interference image between the images of the monitor pattern (light-transmitting portion: opening) is represented by I1; the luminance of the interference image between the image of the monitor pattern and the image of the peripheral area (half-tone film area) is represented by I2; the luminance of the interference image between the images of the peripheral area is represented by I3; the luminance of light passing through the monitor pattern is represented by AQZ; and the luminance of light passing through the peripheral area is represented by ATH. The above-mentioned luminances of the three interference images are respectively expressed by the following equations.

$$I1=AQZ^2+AQZ^2+2\sqrt{AQZ}\times\sqrt{AQZ}\times\cos\phi a$$

$$I2=AQZ^2+AHT^2+2\sqrt{AQZ}\times\sqrt{AHT}\times\cos\phi b$$

$$I3=AHT^2+AHT^2+2\sqrt{AHT}\times\sqrt{AHT}\times\cos\phi c$$

Factors for the luminance values I1 to I3 associated with the transmittance are defined in the section that stipulates the respective amplitudes in the above equations, Assuming that the amplitudes of the luminance values I1 to I3 are represented by Amp 1 to Amp 3, respectively, the following equations are obtained, $$Amp1=2\sqrt{AQZ}\times\sqrt{AQZ}$$

$$Amp2=2\sqrt{AQZ}\times AHT$$

$$Amp3=2\sqrt{AHT}\times\sqrt{AHT}$$

In this case, a relative transmittance T of the phase shifter based on the transmittance of a quartz glass area (opening) is defined by the following equation.

$$T=Amp3/Amp1$$

$$=AHT/AQZ$$

A phase of the QZQZ portion (interference between the two monitor patterns) is represented by ϕa. A phase of the QZHT portion (interference between the monitor pattern and the peripheral area) is represented by ϕb. A phase of the HTHT portion (interference between the two peripheral areas) is represented by ϕc. The transmittance defined by the above equation is used in the measurement of the related art.

The above equation can be further expanded as follows.

$$T=AHT/AQZ$$

$$=(\sqrt{AHT}/\sqrt{AQZ})^2$$

$$=(Amp3/Amp2)^2$$

As shown in the above equation, the relative transmittance of the phase shifter based on the transmittance of the quartz glass can be obtained from the ratio between the amplitude of the luminance of the interference image between the image of the monitor pattern and the image of the peripheral area and the amplitude of the luminance of the interference image between the images of the peripheral area. Accordingly, the interference images shown in FIGS. 3A to 3C are modulated by one period to obtain the amplitude of the first or second interference image and the amplitude of the third interference image, and a square of the ratio between the obtained amplitudes is calculated. In this manner, the transmittance of the phase shifter (half-tone film: light shielding film) based on the transmittance of the quartz glass area can be obtained.

Figure 6:
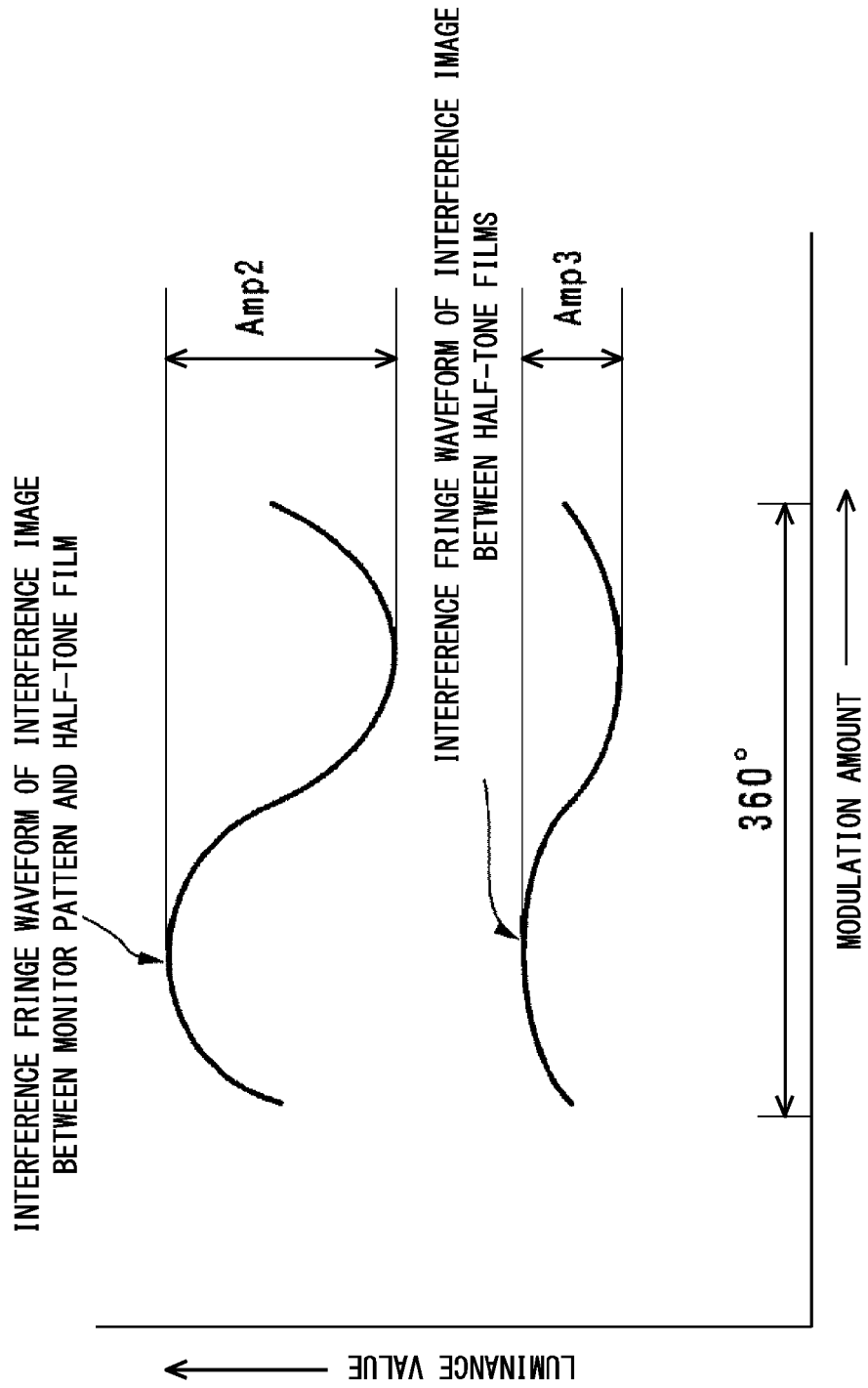
FIG. 6 is a graph showing a change in luminance of first to third interference images during a fringe-scan.

FIG. 6 shows changes in luminance of the first and third interference images, i.e., interference fringe waveforms thereof, when a phase modulation of one period is performed. When a phase modulation of one period is performed, the interference fringe waveforms of the first and second interference images can be obtained and the interference fringe waveform of the interference image between half-tone films can also be obtained. Accordingly, the signal processor 17 divides the amplitude Amp 3 by the amplitude Amp 2 and squares the value obtained by the division, thereby obtaining the transmittance of the half-tone film (phase shifter). In this manner, according to the present invention, the phase shift amount and the transmittance of the phase shifter can be simultaneously measured in one measurement operation.

Figure 7:
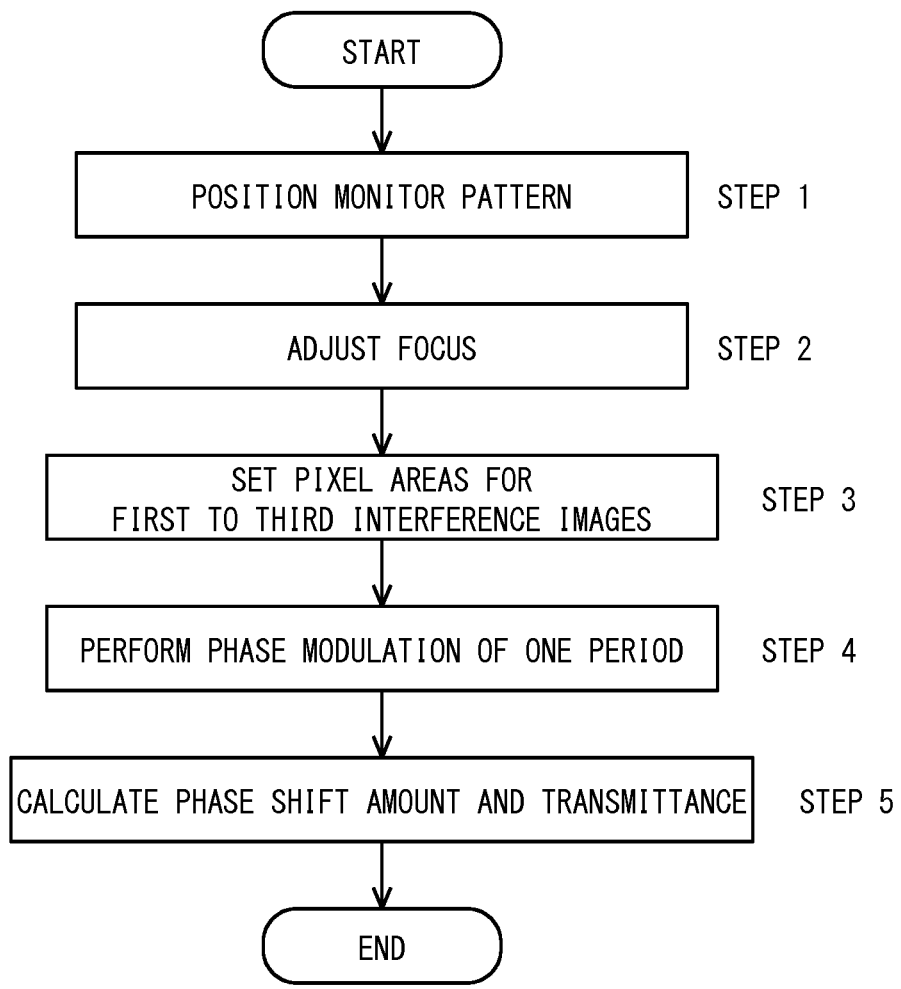
FIG. 7 is a flowchart showing an algorithm for a measuring method according to the present invention.

FIG. 7 is a flowchart showing an algorithm for a measuring method according to the present invention. In step 1, the stage that holds the phase shift mask is moved to position the monitor pattern at the center of the field of view of the two-dimensional imaging device. Subsequently, in step 2, a focus adjustment is performed.

In step 3, the pixel areas in which the first and third interference images are respectively formed are specified, while the image of the monitor pattern formed on the monitor is observed, to thereby determine the measurement area.

In step 4, fringe-scanning is performed and a phase modulation of one period is also performed. Further, the phase modulation data indicating the relationship between the phase modulation amount and the luminance value is obtained and stored in a memory.

In step 5, the phase shift amount and the transmittance of the monitor pattern are calculated using the phase modulation data. In this case, for example, the phase shift amount can be obtained from the modulation amount between the peak values of the first and second interference images. As for the transmittance of the monitor pattern, an amplitude is obtained from the luminance value between the peaks of the waveform of the first interference image, and an amplitude is obtained from the luminance value between the peaks of the third interference image. The two amplitude values thus obtained are divided and the value obtained by the division is squared, to thereby obtain the transmittance, The present invention is not limited only to the above embodiments and can be modified and changed in various manners. For example, in the embodiments described above, the two-dimensional imaging device is used as the photo-detection means and the first to third interference images are formed on the two-dimensional imaging device. However, it is also possible to use three photomultipliers as the photo-detection means to detect the luminance of interference light that forms the first to third interference images.

While the Mach-Zehnder interferometer is used as the shearing interferometer in the above embodiments, a Nomarski prism or a Wollaston prism can also be used.

The signal processor 17 is a personal computer or the like and executes the process as described above. The units of the signal processor 17 may each be configured, as hardware, by a CPU, memory, or a circuit in another form, or, as software, by a program loaded into a memory. Accordingly, these function blocks may be realized in a form of hardware, software, or a combination of the two as commonly understood by persons having ordinary skill in the art, and are not be limited to any specific form. Further, it is to be noted that the elements having substantially the same features depicted in the drawings will be assigned the same reference numerals, and the description thereof will not be repeated as appropriate.

Further, the program may be stored by using various types of non-transitory computer readable medium, and supplied to computers. The non-transitory computer readable medium includes various types of tangible storage medium. Examples of the non-transitory computer readable medium include a magnetic recording medium (such as a flexible disk, a magnetic tape, and a hard disk drive), a magneto-optic recording medium (such as a magneto-optic disk), a CD-ROM (Read Only Memory), a CD-R, and a CD-R/W, and a semiconductor memory (such as a mask ROM, a PROM (Programmable ROM), an EPROM (Erasable PROM), a flash ROM, and a RAM (Random Access Memory)). Further, the program may be supplied to computers by using various types of transitory computer readable media. Examples of the transitory computer readable media include an electrical signal, an optical signal, and an electromagnetic wave. The transitory computer readable media may be used to supply programs to computer through a wire communication path such as an electrical wire and an optical fiber, or wireless communication path.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A measuring method that simultaneously measures a phase shift amount and a transmittance of a phase shifter by using a shearing interferometer, the phase shifter being formed in a half-tone type phase shift mask, the measuring method comprising the steps of:

projecting an illumination beam toward a monitor pattern, the monitor pattern being formed of a light-transmitting portion formed on a half-tone film, or being formed of the half-tone film formed on the light-transmitting portion;

adjusting a shearing amount of a shearing interferometer and forming, on a two-dimensional imaging device, first to third interference images, the first and second interference images being formed by transmitted light transmitted through the monitor pattern and transmitted light transmitted through a peripheral area of the monitor pattern, the third interference image being formed by transmitted light beams transmitted through the peripheral area of the monitor pattern;

performing a phase modulation of one period on laterally-shifted interference images including the first to third interference images, and obtaining, for each of the first to third interference images, phase modulation data indicating a relationship between a phase modulation amount and a luminance value;

calculating, as the phase shift amount of the phase shifter, a phase shift amount between the first interference image and the second interference image by using the phase modulation data on the first and second interference images; and calculating, as the transmittance of the phase shifter, a square of a ratio between an amplitude of the phase modulation data on the first interference image and an amplitude of the phase modulation data on the third interference image.

2. The measuring method according to claim 1, wherein a monitor pattern formed of the light-transmitting portion having an elongated stripe shape and formed on the half-tone film, or a monitor pattern formed of the half-tone film having an elongated stripe shape and formed on the light-transmitting portion is used as the monitor pattern.

3. The measuring method according to claim 2, wherein a Mach-Zehnder interferometer including first and second double wedges is used as the shearing interferometer to form the first and second interference images not overlapping each other on the two-dimensional imaging device by adjusting the first double wedge, and a phase modulation of one period is performed on the first to third interference images by continuously controlling the second double wedge.

4. The measuring method according to claim 1, wherein phase modulation data is created using output signals output from pixel areas in which the first to third interference images are respectively picked up.

5. A measuring apparatus that simultaneously measures a phase shift amount and a transmittance of a phase shifter formed in a half-tone type phase shift mask, the measuring apparatus comprising:
- a lighting system that projects an illumination beam toward a monitor pattern, the monitor pattern being formed of a light-transmitting portion formed on a half-tone film, or being formed of the half-tone film formed on the light-transmitting portion;
- an objective lens that condenses light transmitted through the half-tone type phase shift mask;
- a shearing interferometer that forms first and second laterally-shifted shearing beams from the light condensed by the objective lens, and forms an interference beam by combining the first and second shearing beams;
- a two-dimensional imaging device that picks up laterally-shifted interference images including first to third interference images, the first and second interference images being formed by transmitted light transmitted through the monitor pattern and transmitted light transmitted through a peripheral area of the monitor pattern, the third interference image being formed by transmitted light beams transmitted through the peripheral area of the monitor pattern; and
- a processor that processes an output signal from the two-dimensional imaging device, wherein
a phase modulation of one period is performed on the laterally-shifted interference images including the first to third interference images by adjusting a shearing amount of the shearing interferometer, and phase modulation data indicating a relationship between a phase modulation amount and a luminance value is obtained for each of the first to third interference images,
the processor calculates, as the phase shift amount of the phase shifter, a phase shift amount between the first interference image and the second interference image by using the phase modulation data on the first and second interference images, and
the processor calculates, as the transmittance of the phase shifter, a square of a ratio between an amplitude of the phase modulation data on the first interference image and an amplitude of the phase modulation data on the third interference image.

6. The measuring apparatus according to claim 5, wherein a monitor pattern formed of the light-transmitting portion having an elongated stripe shape and formed on the half-tone film, or a monitor pattern formed of the half-tone film having an elongated stripe shape and formed on the light-transmitting portion is used as the monitor pattern.

7. The measuring apparatus according to claim 6, wherein a Mach-Zehnder interferometer including first and second double wedges is used as the shearing interferometer to form the first and second interference images not overlapping each other on the two-dimensional imaging device by adjusting the first double wedge, and a phase modulation of one period is performed on the first to third interference images by continuously controlling the second double wedge.

8. The measuring apparatus according to claim 5, wherein phase modulation data is created using output signals output from pixel areas in which the first to third interference images are respectively picked up.

* * * * *